(12) United States Patent
Matsumoto

(10) Patent No.: US 9,900,973 B2
(45) Date of Patent: Feb. 20, 2018

(54) COOLING DEVICE

(71) Applicant: NEC Corporation, Minato-ku, Tokyo (JP)

(72) Inventor: Yuki Matsumoto, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 14/867,465

(22) Filed: Sep. 28, 2015

(65) Prior Publication Data
US 2016/0150631 A1 May 26, 2016

(30) Foreign Application Priority Data
Nov. 25, 2014 (JP) .................. 2014-237816

(51) Int. Cl.
H05K 7/20 (2006.01)
H01L 23/40 (2006.01)
H01L 23/36 (2006.01)
H05K 1/02 (2006.01)

(52) U.S. Cl.
CPC .......... *H05K 1/0204* (2013.01); *H01L 23/36* (2013.01); *H01L 23/40* (2013.01); *H05K 7/2039* (2013.01); *H05K 2201/066* (2013.01); *H05K 2201/10409* (2013.01)

(58) Field of Classification Search
CPC ..... H01L 2023/4037; H01L 2023/4062; H01L 2023/4068; H01L 23/34; H05K 2201/066
See application file for complete search history.

(56) References Cited

U.S. PATENT DOCUMENTS

| 6,101,090 A * | 8/2000 | Gates ................. H05K 7/20136 165/104.33 |
| 7,106,595 B2 * | 9/2006 | Foster, Sr. .............. G06F 1/185 165/80.3 |
| 7,480,147 B2 * | 1/2009 | Hoss ......................... G06F 1/20 361/715 |
| 8,767,403 B2 * | 7/2014 | Rau .......................... G06F 1/20 361/721 |

FOREIGN PATENT DOCUMENTS

| JP | H11352190 A | 12/1999 |
| JP | 2005223099 A | 8/2005 |
| JP | 2008084215 A | 4/2008 |
| JP | 2010094144 A | 4/2010 |

* cited by examiner

Primary Examiner — Robert J Hoffberg
Assistant Examiner — Hung Dang

(57) ABSTRACT

The object of the present invention is to provide a cooling device capable of more efficiently cooling heating components heated. The cooling device has a first heat sink and a heat conductor. The first heat sink is thermally coupled to a first heating component mounted on a first surface of a circuit board. The heat conductor is thermally coupled to a second heating component mounted on a second surface of the circuit board and is thermally coupled to the first heat sink.

11 Claims, 10 Drawing Sheets

COOLING DEVICE

This application is based upon and claims the benefit of priority from Japanese Patent application No. 2014-237816, filed on Nov. 25, 2014, the disclosure of which is incorporated herein in its entirety by reference.

BACKGROUND

The embodiments of the present invention relate to a cooling device, and more particularly to a cooling device capable of more efficiently cooling heating components heated.

Recently, Japanese Patent Application Publication No. 2005-223099 discloses a technique for cooling a plurality of electronic components mounted on an electronic circuit board 11 using a cooling device 16, as the invention of, for example, an electronic circuit board device. In the technique described in Japanese Patent Application Publication No. 2005-223099, a plurality of electronic components (densely packed, solidified electronic components 12c) are mounted on the electronic board (electronic circuit board 11). An electronic component heat conducting cover 15 covers the plurality of electronic components mounted on the electronic board. The electronic component heat conducting cover 15 thermally conductively receives radiant heat generated by the plurality of electronic components. The electronic component heat conducting cover 15 is thermally conductively connected to a radiating fin 13. The electronic component heat conducting cover 15 transfers the heat from the plurality of electronic components to the radiating fin 13. A cooling device driving unit 16a and the radiating fin 13 are connected to each other via a coolant pipe 16b (water cooling pipe). The coolant pipe 16b passes through the radiating fin 13. The heat generated by the plurality of electronic components is transferred to the cooling device driving unit 16a via the electronic component heat conducting cover 15, the radiating fin 13, and the coolant pipe 16b. In the technique described in Japanese Patent Application Publication No. 2005-223099, it is possible to cool the plurality of electronic components mounted on the electronic circuit board 11.

Japanese Patent Application Publication Nos. 2008-84215, H11-352190, and 2010-94144 also disclose techniques related to the present invention.

However, in the technique described in Japanese Patent Application Publication No. 2005-223099, the electronic component heat conducting cover is separated from the plurality of electronic components. As a result, there is a problem that thermal conductivity is poor.

SUMMARY OF THE INVENTION

An exemplary object of the embodiments of the present invention is to provide a cooling device capable of more efficiently cooling heating components heated.

According to a non-limiting illustrative embodiment, a cooling device comprising: a first heat sink which is thermally coupled to a first heating component mounted on a first surface of a circuit board; and a heat conductor which is thermally coupled to a second heating component mounted on a second surface, of the circuit board and is thermally coupled to the first heat sink.

BRIEF DESCRIPTION OF THE DRAWINGS

Other features and advantages of various embodiments of the present invention will become apparent by the following detailed description and the accompanying drawings, wherein.

DETAILED DESCRIPTION

A first exemplary embodiment of the present invention will be described in detail below.

Figure 1:
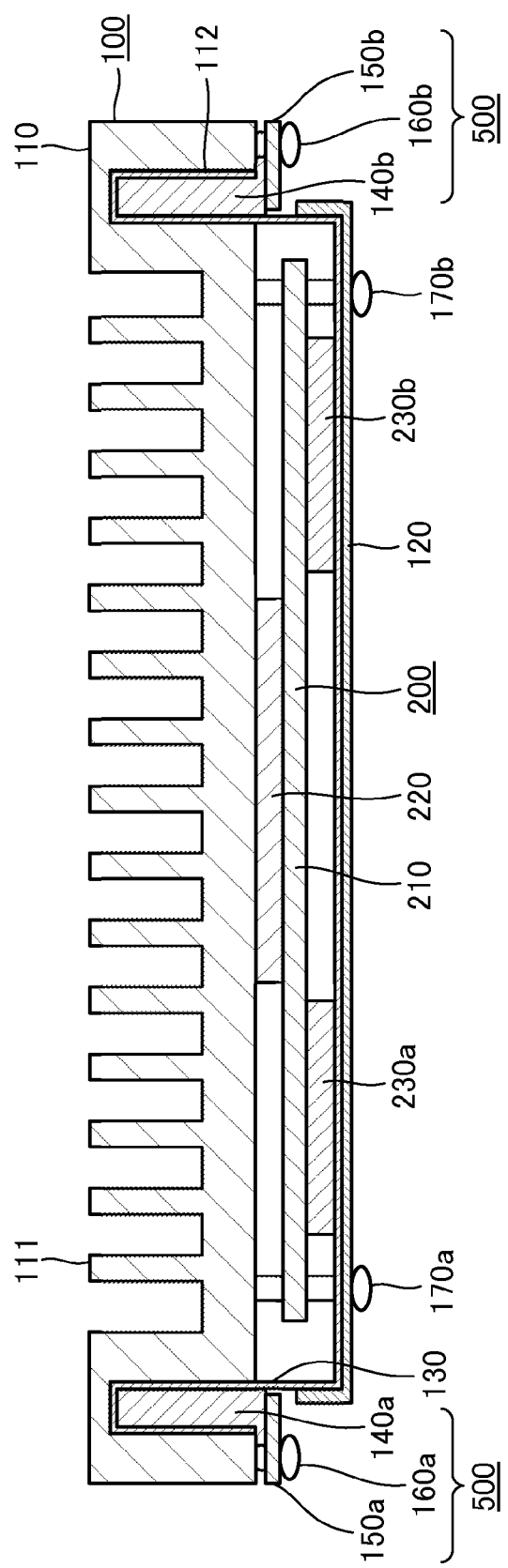
FIG. 1 is a side view illustrating a cooling device mounted on an electronic board in a first exemplary embodiment of the present invention.
Figure 2:
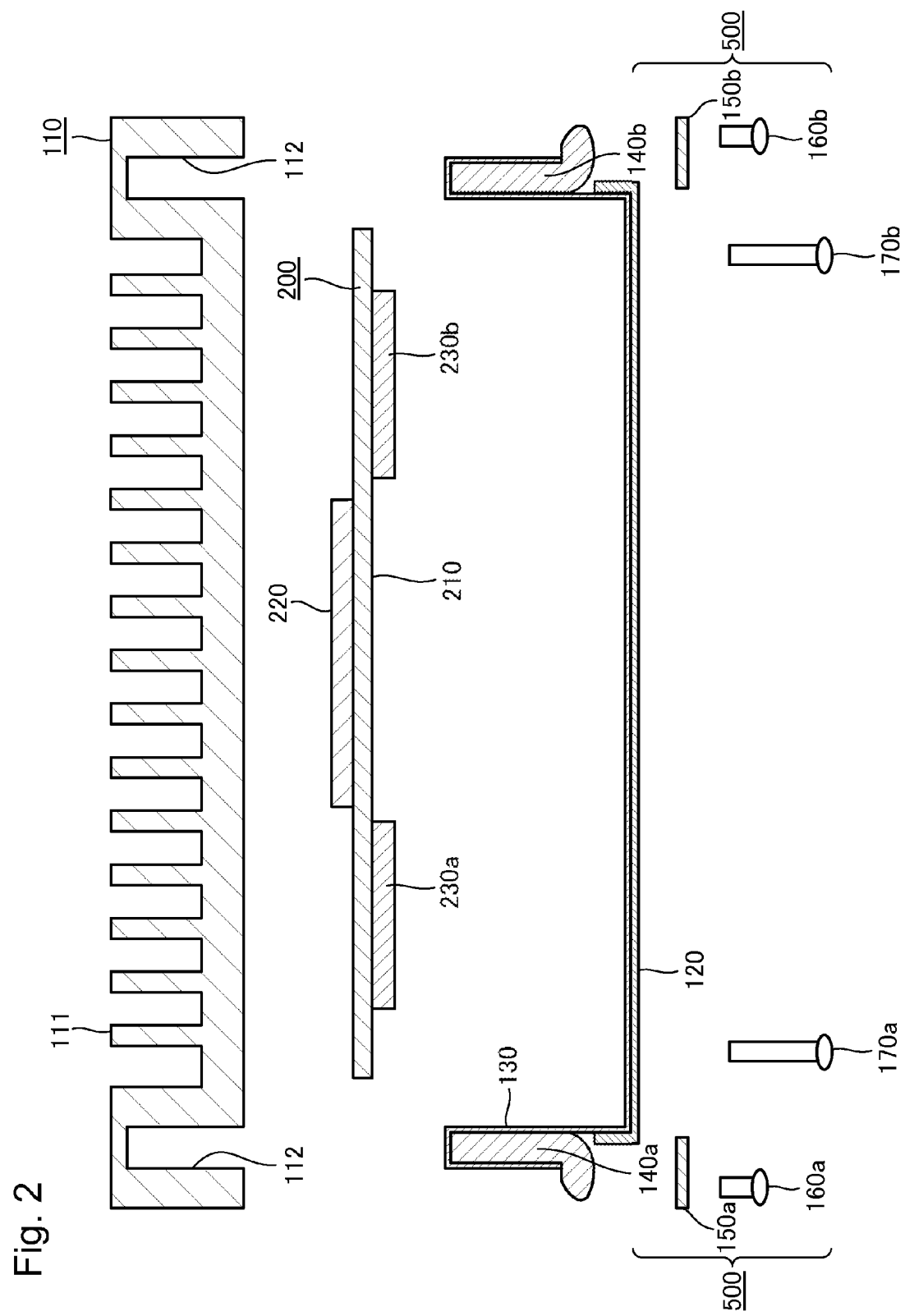
FIG. 2 is a side view showing the state before the cooling device is mounted on the electronic board.

FIG. 1 is a side view illustrating a cooling device 100 mounted on an electronic board 200. FIG. 2 is a side view showing the state before the cooling device 100 is mounted on the electronic board 200.

An exemplary configuration of the electronic board 200 will now be described.

Referring to FIG. 1 and FIG. 2, the electronic board 200 includes a circuit board 210, a first heating component 220, and second heating components 230a and 230b.

The circuit board 210 has a plate shape. The circuit board 210 is made of a material such as glass epoxy resin. The circuit board 210 includes screw holes (not illustrated) at positions to receive collective fastening screws 170a and 170b (to be described later).

The first heating component 220 is mounted on the upper surface (on the upper side of the paper surface of each of FIG. 1 and FIG. 2) of the circuit board 210. The upper surface of the circuit board 210 corresponds to a first surface of a circuit board in the exemplary embodiment of the present invention. The second heating components 230a and 230b are mounted on the lower surface (on the lower side of the paper surface of each of FIG. 1 and FIG. 2) of the circuit board 210. The second heating component 230a is equal in height to the second heating component 230b.

When there is no need to distinguish the second heating components 230a and 230b from each other, they will be collectively referred to as second heating components 230 hereinafter. The lower surface of the circuit board 210 is opposite to the upper surface of the circuit board 210. The lower surface of the circuit board 210 corresponds to a second surface of the circuit board in the exemplary embodiment of the present invention. The first heating component 220 and the second heating component 230 act as electronic components which generate heat upon activation of the first heating component 220 and the second heating component 230.

The first heating component 220 and the second heating component 230 are implemented in, for example, CPUs (Central Processing Units).

Next, an exemplary configuration of the cooling device 100 will be described.

Referring to FIG. 1 and FIG. 2, the cooling device 100 includes a first heat radiating unit 110 such as a first heat sink, a second heat radiating unit 120 such as a second heat sink, a heat conducting unit 130 such as a heat conductor, bag bodies 140a and 140b, plate members 150a and 150b such as plates, the collective fastening screws 170a and 170b, and plate member fastening screws 160a and 160b.

The cooling device 100 according to the present invention need only include at least the first heat radiating unit 110 and the heat conducting unit 130 to achieve the above-mentioned exemplary object of the present invention. Pressing units 500 each correspond to a member including the bag body 140a or 140b, the plate member 150a or 150b, and the plate member fastening screw 160a or 160b. The pressing units 500 press the heat conducting unit 130 toward the first heat radiating unit 110 to bring the heat conducting unit 130 into close contact with the first heat radiating unit 110.

Referring to FIG. 1, the first heat radiating unit 110 is thermally coupled to the first heating component 220 mounted on the upper surface of the circuit board 210.

Referring to FIG. 1 and FIG. 2, the first heat radiating unit 110 according to the present invention includes a plurality of fins 111 and recesses 112. The plurality of fins 111 are arranged in plates and extend away from the upper surface of the circuit board 210. The recesses 112 are formed in the first heat radiating unit 110 at the two end portions so that each recess 112 has a bottom farthest from the upper surface of the circuit board 210 among other areas defining this recess 112.

The first heat radiating unit 110 includes screw holes (not illustrated) at positions to receive the collective fastening screws 170a and 170b and the plate member fastening screws 160a and 160b. The first heat radiating unit 110 is made of, for example, a metal material having high thermal conductivity, such as iron or aluminum.

Referring to FIG. 1 and FIG. 2, the second heat radiating unit 120 faces the lower surface of the first heat radiating unit 110. Referring to FIG. 1 and FIG. 2, the second heat radiating unit 120 has a plate shape. Referring again to FIG. 1 and FIG. 2, the two end portions of the second heat radiating unit 120 are bent toward the first heat radiating unit 110. The heat conducting unit 130 is stacked on one surface of the second heat radiating unit 120. The heat conducting unit 130 is kept in close contact with one surface of the second heat radiating unit 120. The second heat radiating unit 120 includes screw holes (not illustrated) at positions to receive the collective fastening screws 170a and 170b. The second heat radiating unit 120 is made of, for example, a metal material having high thermal conductivity, such as iron or aluminum. The second heat radiating unit 120 is also called a radiator plate.

Referring to FIG. 1 and FIG. 2, the heat conducting unit 130 is kept in close contact with one surface of the second heat radiating unit 120. More specifically, the heat conducting unit 130 is kept in close contact with a surface of the second heat radiating unit 120, which faces the lower surface of the circuit board 210. Referring to FIG. 1, the heat conducting unit 130 is thermally coupled to the second heating components 230a and 230b mounted on the lower surface of the circuit board 210. The heat conducting unit 130 is flexible.

Referring again to FIG. 1 and FIG. 2, the heat conducting unit 130 includes portions extending outwards (extending portions) at the two end portions of the second heat radiating unit 120. The extending portions of the heat conducting unit 130 extend toward the first heat radiating unit 110, at the two end portions of the second heat radiating unit 120.

Referring to FIG. 1, when the cooling device 100 is mounted on the electronic board 200, the extending portions of the heat conducting unit 130 are thermally coupled to the first heat radiating unit 110 within the recesses 112 in the first heat radiating unit 110. The extending portions of the heat conducting unit 130 surround the bag bodies 140a and 140b within the recesses 112 in the first heat radiating unit 110. The heat conducting unit 130 is made of a material such as graphite. The heat conducting unit 130 is also called a graphite sheet.

Referring to FIG. 1, the bag bodies 140a and 140b are accommodated in the recesses 112 of the first heat radiating unit 110. The bag bodies 140a and 140b are surrounded by the extending portions of the heat conducting unit 130 within the recesses 112 in the first heat radiating unit 110. The bag bodies 140a and 140b are filled with a liquid or gas having a volume nearly equal to the internal volume of each recess 112 in advance, and are sealed hermetically. The maximum value of the internal volume of each of the bag bodies 140a and 140b is larger than at least the volume of the filling liquid or gas. The liquid or gas that fills the bag bodies 140a and 140b is movable within the bag bodies 140a and 140b. If the bag bodies 140a and 140b are filled with air, they are also called air bags. When there is no need to distinguish the bag bodies 140a and 140b from each other, they will be collectively referred to as bag bodies 140 hereinafter.

Referring to FIG. 1, the plate members 150a and 150b are attached to the first heat radiating unit 110 by the plate member fastening screws 160a and 160b. The plate members 150a and 150b have a flat plate shape. The plate members 150a and 150b include screw holes (not illustrated) to receive the plate member fastening screws 160a and 160b. When the plate members 150a and 150b are attached to the first heat radiating unit 110 by the plate member fastening screws 160a and 160b, the plate members 150a and 150b compress the bag bodies 140a and 140b. More specifically, the bag bodies 140a and 140b are compressed between the plate members 150a and 150b and the first heat radiating unit 110 within the recesses 112 in the first heat radiating unit 110. The plate members 150a and 150b compress the bag bodies 140a and 140b between the plate members 150a and 150b and the bottom surfaces defining the recesses 112 in the first heat radiating unit 110. This presses the heat conducting unit 130 toward the first heat radiating unit 110. Therefore, the heat conducting unit 130 and the first heat radiating unit 110 are pressed against each other. The heat conducting unit 130 and the first heat radiating unit 110 are then thermally coupled to each other.

Referring to FIG. 1 and FIG. 2, the collective fastening screws 170a and 170b are inserted into screw holes (not illustrated) formed in the first heat radiating unit 110, the circuit board 210, and the second heat radiating unit 120.

Referring to FIG. 1 and FIG. 2, the plate member fastening screws 160a and 160b are inserted into screw holes (not illustrated) formed in the first heat radiating unit 110 and the plate members 150a and 150b. The plate member fastening screws 160a and 160b fasten the plate members 150a and 150*b* to the first heat radiating unit 110. The plate member fastening screws 160*a* and 160*b* each correspond to a fastening member according to the present invention.

A method for mounting a cooling device 100 on an electronic board 200 will be described below.

An electronic board 200, a first heat radiating unit 110, and a second heat radiating unit 120 in close contact with a heat conducting unit 130 are prepared first.

The electronic board 200 and the second heat radiating unit 120 are arranged so that the heat conducting unit 130 and the lower surface of the circuit board 210 face each other. The electronic board 200 is mounted on the second heat radiating unit 120. This thermally couples the second heating components 230*a* and 230*b* mounted on the lower surface of the circuit board 210 and the heat conducting unit 130 to each other. As a result, the second heating components 230*a* and 230*b* and the heat conducting unit 130 are thermally coupled to each other.

The first heat radiating unit 110 is mounted on the electronic board 200. At this time, the first heat radiating unit 110 is mounted on the electronic board 200 so that the first heat radiating unit 110 and the upper surface of the circuit board 210 face each other. This thermally couples the first heating component 220 mounted on the upper surface of the circuit board 210 and the first heat radiating unit 110 to each other. As a result, the first heating component 220 and the heat conducting unit 130 are thermally coupled to each other.

In mounting the first heat radiating unit 110 on the electronic board 200, the heat conducting unit 130 and the bag bodies 140*a* and 140*b* are placed in the recesses 112 of the first heat radiating unit 110.

Figure 3:
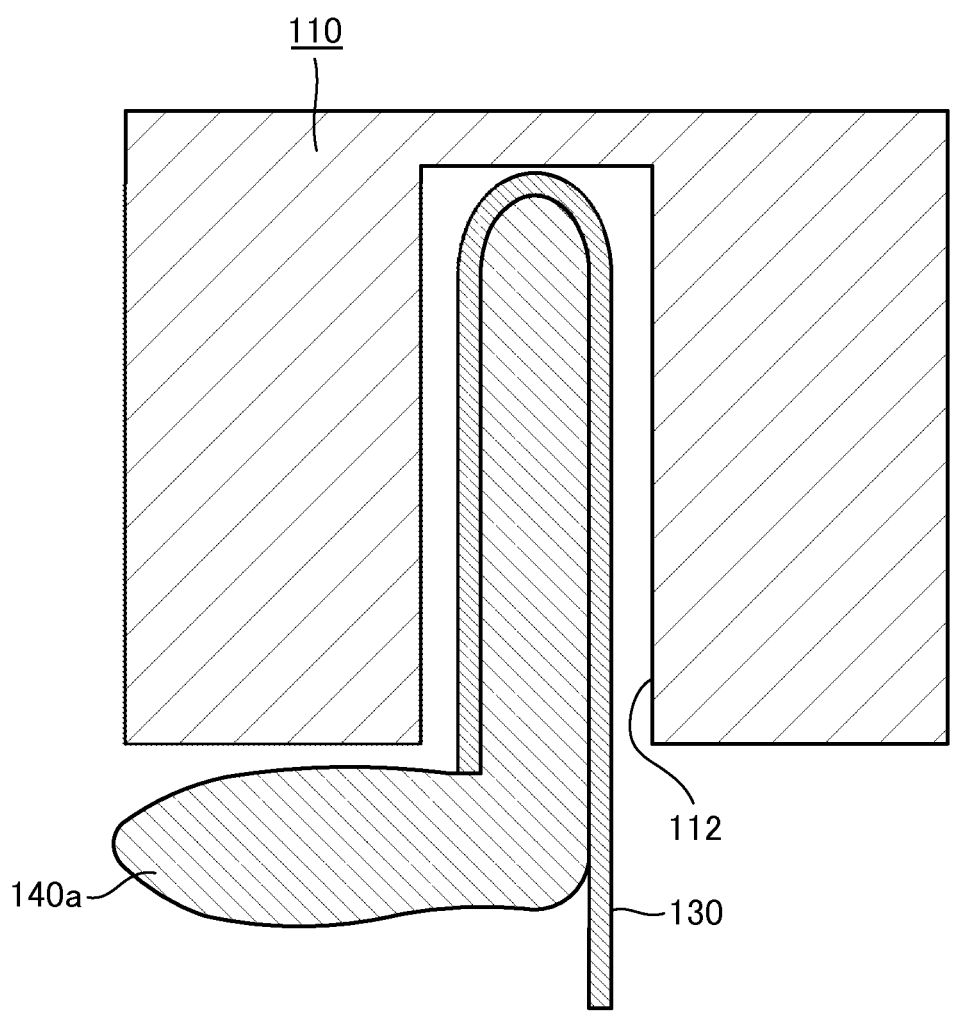
FIG. 3 is a view for explaining a method for bringing a heat conducting unit into close contact with the interior of a recess in a first heat radiating unit.
Figure 4:
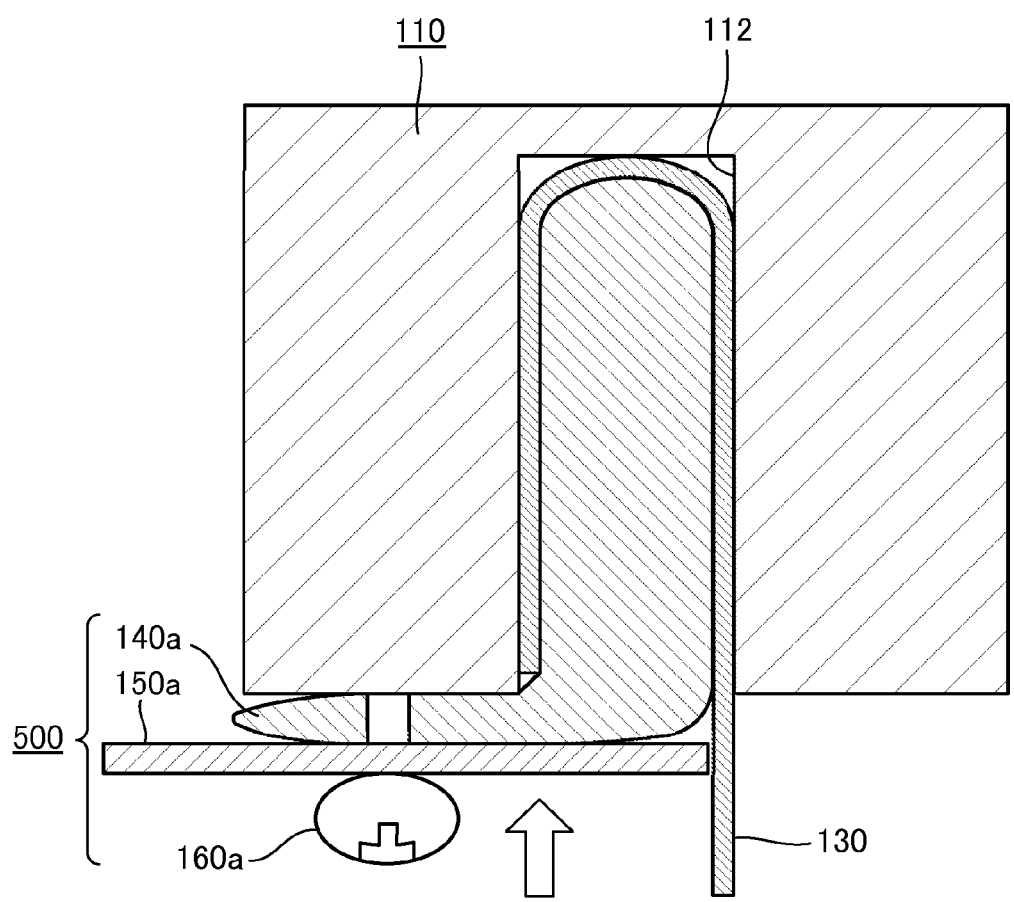
FIG. 4 is a view for explaining the method for bringing the heat conducting unit into close contact with the interior of the recess in the first heat radiating unit.

FIG. 3 and FIG. 4 are views for explaining a method for bringing the heat conducting unit 130 into close contact with the interior of the recess 112 in the first heat radiating unit 110 for the cooling device 100 according to the first exemplary embodiment. FIG. 3 illustrates the cooling device 100 according to the first exemplary embodiment before the heat conducting unit 130 is brought into close contact with the interior of the recess 112 in the first heat radiating unit 110. FIG. 4 illustrates the cooling device 100 according to the first exemplary embodiment after the heat conducting unit 130 is brought into close contact with the interior of the recess 112 in the first heat radiating unit 110. Referring to FIG. 3 and FIG. 4, the heat conducting unit 130 and the bag body 140*a* are placed in the left recess 112 on the paper surface of each of FIG. 1 and FIG. 2. However, basically the same applies to the heat conducting unit 130 and the bag body 140*b* that are placed in the right recess 112 on the paper surface of each of FIG. 1 and FIG. 2, except for the use of configurations bilaterally symmetrical about those shown in FIG. 3 and FIG. 4.

Referring to FIG. 3, in mounting the first heat radiating unit 110 on the electronic board 200, the heat conducting unit 130 and the bag body 140*a* are inserted into the left recess 112 in the first heat radiating unit 110 while deforming the bag body 140*a*. Similarly, in mounting the first heat radiating unit 110 on the electronic board 200, the heat conducting unit 130 and the bag body 140*b* are inserted into the right recess 112 in the first heat radiating unit 110 while deforming the bag body 140*b*. At this time, the maximum value of the internal volume of each of the bag bodies 140*a* and 140*b* is larger than at least the volume of the filling liquid or gas, as described earlier. The liquid or gas that fills the bag bodies 140*a* and 140*b* is movable within the bag bodies 140*a* and 140*b*. This can easily deform the bag bodies 140*a* and 140*b*. It is, therefore, possible to easily insert the heat conducting unit 130 and the bag bodies 140*a* and 140*b* into the recesses 112 in the first heat radiating unit 110. Referring to FIG. 3, it is confirmed whether the upper end portions of the bag bodies 140*a* and 140*b* are reliably inserted into the recesses 112. It is also confirmed whether the lower end portions of the bag bodies 140*a* and 140*b* jut out of the recesses 112 in the first heat radiating unit 110.

At this time, the collective fastening screws 170*a* and 170*b* are inserted and fastened into the screw holes in the second heat radiating unit 120, the circuit board 210, and the first heat radiating unit 110. Hence, the first heat radiating unit 110 holds the electronic board 200 and the second heat radiating unit 120.

Referring to FIG. 4, the plate members 150*a* and 150*b* are attached to the first heat radiating unit 110 from the lower surface side while crushing the lower end portions of the bag bodies 140*a* and 140*b* jutting out of the recesses 112 in the first heat radiating unit 110. In this way, pressing the bag bodies 140*a* and 140*b* by the plate members 150*a* and 150*b* moves the gas or liquid on the lower sides of the bag bodies 140*a* and 140*b* to the upper sides of the bag bodies 140*a* and 140*b*. The movement of the gas or the liquid expands the bag bodies 140*a* and 140*b* in the recesses 112 of the first heat radiating unit 110. The force acting to expand the bag bodies 140*a* and 140*b* brings the heat conducting unit 130 into close contact with the inner walls defining the recesses 112. In this state, the plate members 150*a* and 150*b* are screwed to the lower surface of the first heat radiating unit 110 using the plate member fastening screws 160*a* and 160*b*.

Next, the operation of the cooling device 100 of the first exemplary embodiment will be described.

More specifically, a sequence executed until radiation of heat generated by the first heating component 220 and second heating component 230 mounted on the two surfaces of the circuit board 210 of the electronic board 200 will be described below.

When power is supplied to the electronic board 200, the first heating component 220 and the second heating components 230*a* and 230*b* generate heat.

At this time, the first heating component 220 and the first heat radiating unit 110 are thermally coupled to each other. Therefore, heat generated by the first heating component 220 is transferred to the first heat radiating unit 110. The first heat radiating unit 110 radiates the heat generated by the first heating component 220.

The second heating components 230*a* and 230*b* are kept in close contact with and thermally coupled to the heat conducting unit 130. Therefore, heat generated by the second heating components 230*a* and 230*b* is transferred to the heat conducting unit 130 first. The heat generated by the second heating components 230*a* and 230*b* is transferred in the planar direction of the heat conducting unit 130 and further transferred into the recesses 112. In the recesses 112, the first heat radiating unit 110 and the heat conducting unit 130 are thermally coupled to each other. In these contact portions, the upper surface of the heat conducting unit 130 is kept in close contact with the first heat radiating unit 110. The upper surface of the heat conducting unit 130 also serves as a surface thermally coupled to the second heating components 230*a* and 230*b*. This efficiently transfers heat generated by the second heating components 230*a* and 230*b* to the first heat radiating unit 110 through the heat conducting unit 130.

As described above, both heat generated by the first heating component 220 and heat generated by the second heating components 230*a* and 230*b* are transferred to the first heat radiating unit 110. Hence, the first heat radiating unit 110 collectively radiates both heat generated by the first heating component 220 and heat generated by the second heating components 230*a* and 230*b*.

The use of graphite as the heat conducting unit 130 will now be described. Graphite is known to generally have high thermal conductivity (twice to four times the thermal conductivity of copper) in the planar direction. The use of graphite as the heat conducting unit 130, therefore, allows more efficient transfer of heat generated by the second heating components 230*a* and 230*b* to the first heat radiating unit 110.

As described above, the cooling device 100 according to the first exemplary embodiment of the present invention includes a first heat radiating unit 110 and a heat conducting unit 130.

The first heat radiating unit 110 is thermally coupled to the first heating component 220 mounted on the first surface (upper surface) of the circuit board 210. The heat conducting unit 130 is flexible. The heat conducting unit 130 is thermally coupled to the second heating component 230 mounted on the second surface (lower surface) of the circuit board 210 in the second heat radiating unit 120. The heat conducting unit 130 is also thermally coupled to the first heat radiating unit 110. The second surface (lower surface) of the circuit board 210 is opposite to its first surface (upper surface).

As described above, the first heating component 220 mounted on the first surface of the circuit board 210 is thermally coupled to the first heat radiating unit 110. The second heating component 230 mounted on the second surface of the circuit board 210 is indirectly thermally coupled to the first heat radiating unit 110 through the heat conducting unit 130. At this time, the second heating component 230 is thermally coupled to the second heat radiating unit 120. Hence, the transfer efficiency of heat from the second heating component 230 to the second heat radiating unit 120 can be higher than that obtained in the technique described in Japanese Patent Application Publication No. 2005-223099. This smoothly transfers heat generated by the first heating component 220 and second heating component 230 to the first heat radiating unit 110. This means that the first heat radiating unit 110 can efficiently radiate heat generated by the first heating component 220 and second heating component 230. Thus, the cooling device 100 according to the first exemplary embodiment of the present invention can more efficiently cool heating components heated.

In the technique described in Japanese Patent Application Publication No. 2005-223099, assume, for example, that the electronic component heat conducting cover 15 is thermally coupled to a plurality of electronic components. Then, gaps (e.g., about 0.1 mm to 0.3 mm) are generally generated between the electronic component heat conducting cover 15 and the electronic components. These gaps result from factors associated with the tolerance of size between the electronic component heat conducting cover 15 and the electronic components. In addition, very small projections and grooves are formed on the electronic component heat conducting cover 15 and the surfaces of the electronic components.

It is a common practice to interpose a heat conducting member or grease serving as a TIM (Thermal Interface Material) between the electronic component heat conducting cover 15 and the electronic components. This is to fill both the gaps between the electronic component heat conducting cover 15 and the electronic components, and the projections and grooves formed on the electronic component heat conducting cover 15 and the surfaces of the electronic components. This can transfer heat generated by the electronic components to the electronic component heat conducting cover 15 through the heat conducting member or the grease.

However, a thick TIM may be necessary depending on variations in size of the electronic component heat conducting cover 15 and electronic components. This involves high thermal resistance between the electronic component heat conducting cover 15 and the electronic components.

In contrast to this, the cooling device 100 can keep the thermal resistance between the second heating component 230 and the first heat radiating unit 110 lower than that on the aforementioned assumption. This is because the heat conducting unit 130 itself transfers heat generated by the second heating component 230 to the first heat radiating unit 110. In this manner, the cooling device 100 according to the present invention is less subject to variations in size of the second heating component 230 and first heat radiating unit 110. In the cooling device 100 according to the present invention, the second heating component 230 and the first heat radiating unit 110 can be connected to each other at a relatively low thermal resistance.

Japanese Patent Application Publication No. 2005-223099 also discloses a technique for simultaneously cooling the two surfaces of the electronic circuit board 11 using the cooling device 16. Regarding this, the techniques described in Japanese Patent Application Publication No. 2005-223099 extends the radiating fin 13 across the two surfaces of the electronic circuit board 11. The radiating fin 13 and the cooling device driving unit 16a of the cooling device 16 are connected to each other via the coolant pipe 16b (water cooling pipe). The coolant pipe 16b passes through the radiating fin 13. With such an arrangement, the technique described in Japanese Patent Application Publication No. 2005-223099 can simultaneously cool the two surfaces of the electronic circuit board 11.

However, in the technique described in Japanese Patent Application Publication No. 2005-223099, the radiating fin 13 needs to extend across the two surfaces of the electronic circuit board 11, thus complicating the arrangement. Further, variations in size occur in the electronic component heat conducting cover 15 and the electronic components, as described earlier. This raises the need to provide a thick TIM, which involves high thermal resistance between the electronic component heat conducting cover 15 and the electronic components.

Japanese Patent Application Publication No. 2008-84215 discloses a technique for connecting, using screws, heat radiating members respectively attached to heating components mounted on the two surfaces of a circuit board, as the invention of, for example, an electronic device. This thermally connects two heat radiating members to each other. One of the two heat radiating members is thermally connected to a heat sink. With this structure, the technique described in Japanese Patent Application Publication No. 2008-84215 can cool heating components on the two surfaces of a circuit board at once using only one heat sink. In addition, in the technique described in Japanese Patent Application Publication No. 2008-84215, since two heat radiating members are separated from each other on the two surfaces of the circuit board, variations in height of electronic components mounted on the two surfaces of the circuit board can be absorbed more than the technique described in Japanese Patent Application Publication No. 2005-223099.

Unfortunately, in the technique described in Japanese Patent Application Publication No. 2008-84215, the thermal resistance is high because the contact area of the threaded portions is small.

In contrast to the techniques described in Japanese Patent Application Publication Nos. 2005-223099 and 2008-84215, the cooling device 100 according to the present invention requires no complicated structure to extend heat radiating members across the circuit board. In other words, since the first heating component 220 is directly thermally coupled to the first heat radiating unit 110, a complicated structure, as in the technique described in Japanese Patent Application Publication No. 2005-223099, is not interposed in the heat transfer path from the first heating component 220 to the first heat radiating unit 110. In addition, since the second heating component 230 is indirectly thermally coupled to the first heat radiating unit 110 via the heat conducting unit 130, a complicated structure, as in the technique described in Japanese Patent Application Publication No. 2005-223099, is not interposed in the heat transfer path from the second heating component 230 to the first heat radiating unit 110. Further, as described earlier, in the cooling device 100, since the heat conducting unit 130 itself transfers heat generated by the second heating component 230 to the first heat radiating unit 110, the thermal resistance between the second heating component 230 and the first heat radiating unit 110 can be kept low.

The cooling device 100 does not use screw connection, unlike the technique described in Japanese Patent Application Publication No. 2008-84215. The first heating component 220 of the cooling device 100 is configured to be directly thermally coupled to the first heat radiating unit 110.

As described above, the cooling device 100 according to the present invention is less subject to variations in size of the second heating component 230 and first heat radiating unit 110 than the techniques described in Japanese Patent Application Publication Nos. 2005-223099 and 2008-84215. The cooling device 100 according to the present invention can have a simpler connection configuration with a lower thermal resistance.

This can smoothly transfer heat generated by the first heating component 220 and second heating component 230 to the first heat radiating unit 110. This means that the first heat radiating unit 110 can efficiently radiate heat generated by the first heating component 220 and second heating component 230.

The cooling device 100 according to the first exemplary embodiment of the present invention may further include a second heat radiating unit 120. The second heat radiating unit 120 faces the second surface (lower surface) of the circuit board 210. The heat conducting unit 130 is kept in close contact with a surface of the second heat radiating unit 120, which faces the second surface (lower surface) of the circuit board 210. This also produces the same effect as described above.

The cooling device 100 according to the first exemplary embodiment of the present invention further includes pressing units 500. The pressing units 500 press the heat conducting unit 130 toward the first heat radiating unit 110. Hence, the pressing units 500 bring the heat conducting unit 130 into close contact with the first heat radiating unit 110.

This can more reliably thermally couple the heat conducting unit 130 and the first heat radiating unit 110 to each other. As a result, the heat conducting unit 130 can more reliably transfer heat generated by the second heating component 230 to the first heat radiating unit 110.

In the cooling device 100 according to the first exemplary embodiment of the present invention, each pressing unit 500 includes a bag body 140a or 140b, a plate member 150a or 150b, and a plate member fastening member 160a or 160b. The bag bodies 140a and 140b are filled with a liquid or a gas. The plate member fastening members 160a and 160b fasten the plate members 150a and 150b to the first heat radiating unit 110. In the cooling device 100, the plate member fastening members 160a and 160b are attached to the first heat radiating unit 110 to compress the bag bodies 140a and 140b between the plate members 150a and 150b and the first heat radiating unit 110. The heat conducting unit 130 is pressed toward the first heat radiating unit 110 by compressing the bag bodies 140a and 140b between the plate members 150a and 150b and the first heat radiating unit 110. The heat conducting unit 130 is brought into close contact with the first heat radiating unit 110.

As described above, the plate member fastening members 160a and 160b are attached to the first heat radiating unit 110 to compress the bag bodies 140a and 140b between the plate members 150a and 150b and the first heat radiating unit 110. The heat conducting unit 130 is pressed toward the first heat radiating unit 110 by compressing the bag bodies 140a and 140b between the plate members 150a and 150b and the first heat radiating unit 110. The heat conducting unit 130 is brought into close contact with the first heat radiating unit 110. Thus, the heat conducting unit 130 can be thermally coupled to the first heat radiating unit 110 without any adhesive. This can keep the thermal resistance between the heat conducting unit 130 and the first heat radiating unit 110 low. The heat conducting unit 130 and the first heat radiating unit 110 can be thermally coupled to each other by a simple attaching and detaching operation.

The cooling device 100 according to the first exemplary embodiment of the present invention further includes recesses 112. The recesses 112 are formed in the first heat radiating unit 110. Each pressing unit 500 includes a bag body 140a or 140b, a plate member 150a or 150b, and a plate member fastening member 160a or 160b. The bag bodies 140a and 140b are filled with a liquid or a gas. The plate member fastening members 160a and 160b fasten the plate members 150a and 150b to the first heat radiating unit 110. In the cooling device 100, at least parts of the heat conducting unit 130 and bag bodies 140a and 140b are accommodated in the recesses 112. In the cooling device 100, the plate member fastening members 160a and 160b are attached to the first heat radiating unit 110 to compress the bag bodies 140a and 140b between the plate members 150a and 150b and the first heat radiating unit 110 within the recesses 112. The heat conducting unit 130 is pressed toward the inner surfaces defining the recesses 112 by compressing the bag bodies 140a and 140b between the plate members 150a and 150b and the first heat radiating unit 110. The heat conducting unit 130 is brought into close contact with the inner surfaces defining the recesses 112.

As described above, in the cooling device 100, the heat conducting unit 130 is pressed toward the inner surfaces defining the recesses 112 by compressing the bag bodies 140a and 140b within the recesses 112. The heat conducting unit 130 is brought into close contact with the inner surfaces defining the recesses 112. This can convert the expansion forces of the bag bodies 140a and 140b into forces acting to press the heat conducting unit 130 toward the inner surfaces defining the recesses 112. This, in turn, can more reliably bring the heat conducting unit 130 into close contact with the inner surfaces defining the recesses 112 in the first heat radiating unit 110. As a result, the heat conducting unit 130 can be more reliably thermally coupled to the inner surfaces defining the recesses 112 in the first heat radiating unit 110.

In the cooling device 100 according to the first exemplary embodiment of the present invention, the heat conducting unit 130 is made of graphite. When the heat conducting unit 130 uses a graphite sheet, the graphite sheet is known to generally have high thermal conductivity (twice to four times the thermal conductivity of copper) in the planar direction. Hence, the use of a graphite sheet as the heat conducting unit 130 allows the heat conducting unit 130 to more efficiently transfer heat generated by the second heating components 230a and 230b to the first heat radiating unit 110.

Next, a second exemplary embodiment of the present invention will be described in detail.

Figure 5:
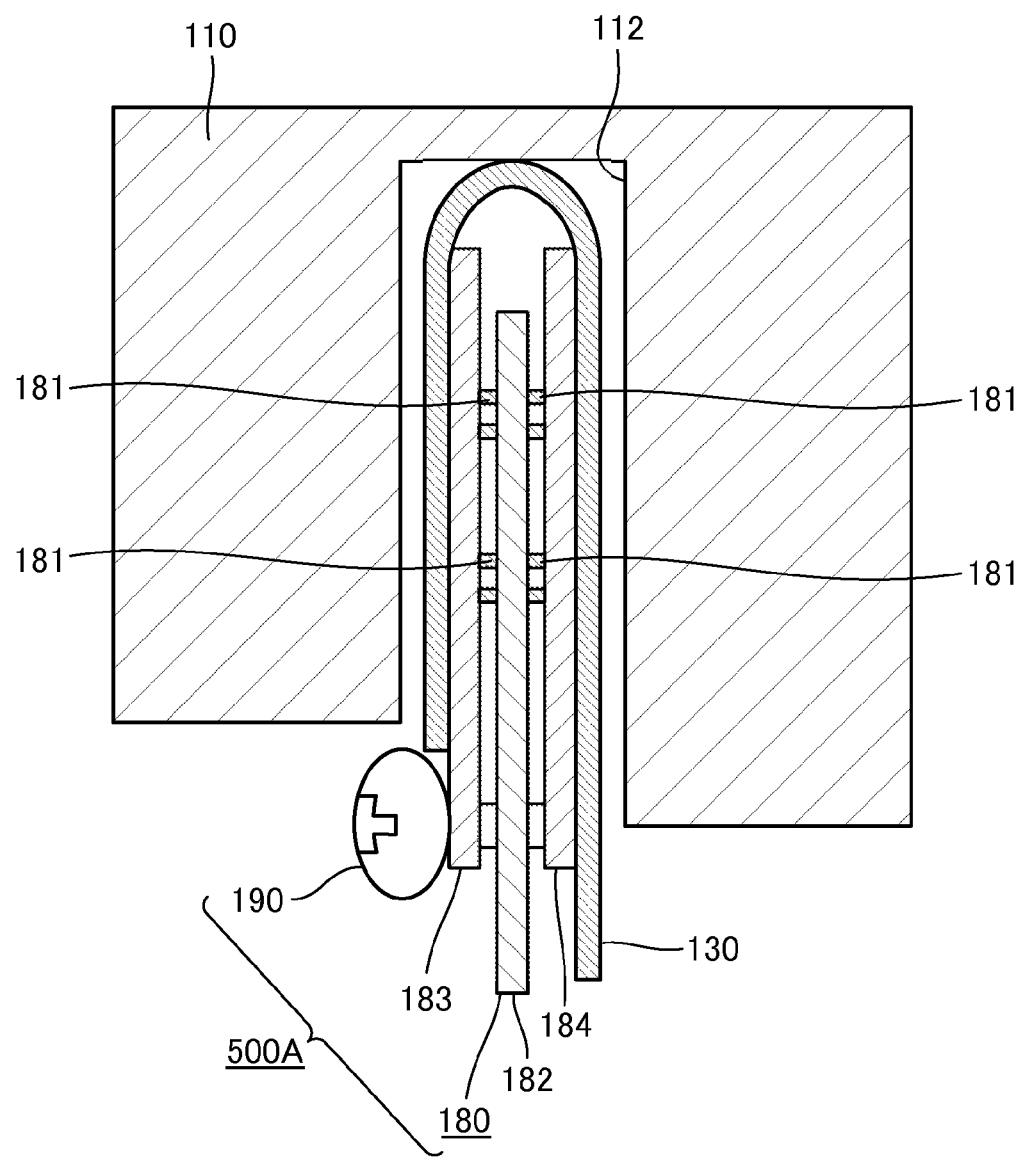
FIG. 5 is a view for explaining a method for bringing a heat conducting unit into close contact with the interior of a recess in a first heat radiating unit in a second exemplary embodiment of the present invention.
Figure 6:
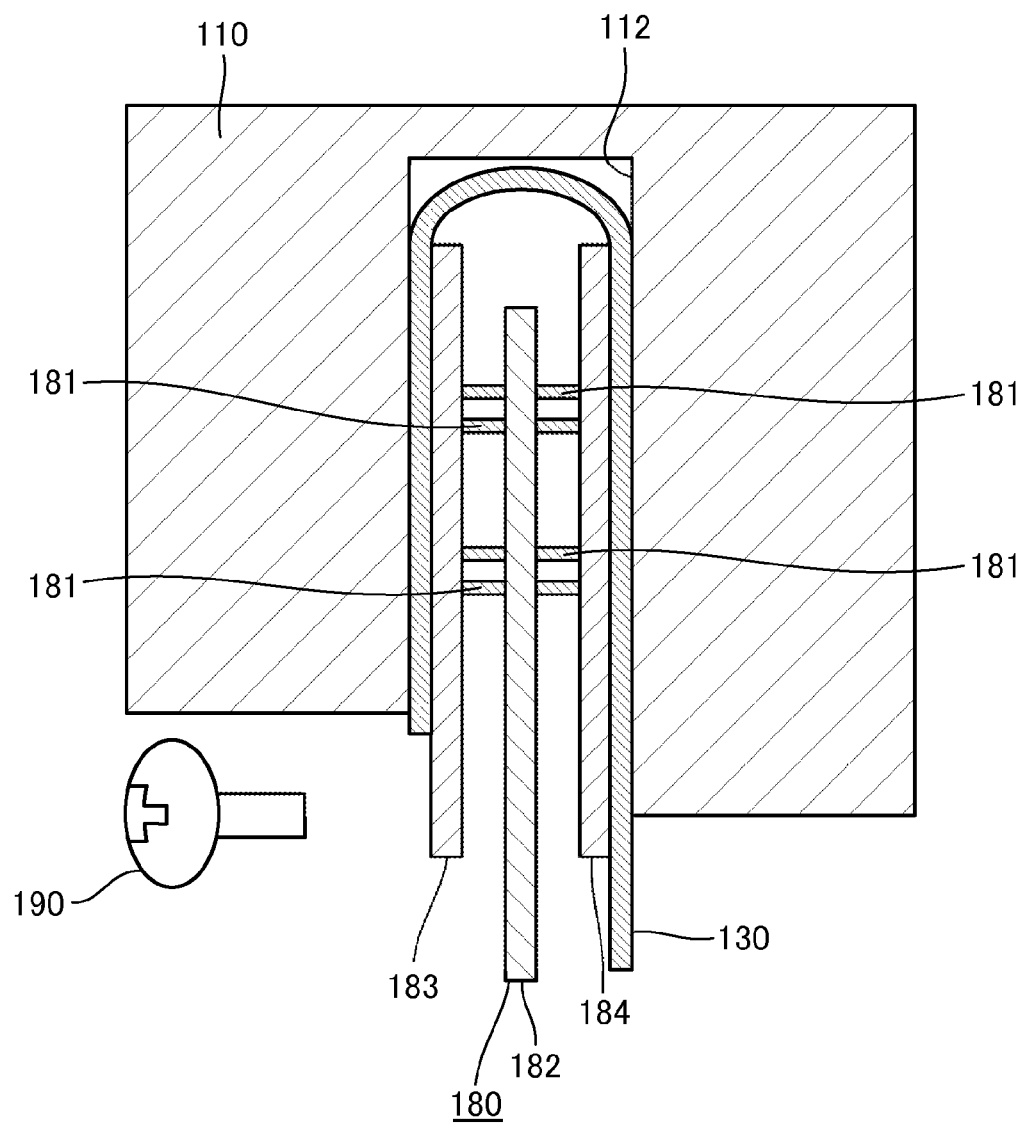
FIG. 6 is a view for explaining the method for bringing the heat conducting unit into close contact with the interior of the recess in the first heat radiating unit.

FIG. 5 and FIG. 6 are views for explaining a method for bringing a heat conducting unit 130 into close contact with the interior of a recess 112 in a first heat radiating unit 110 for a cooling device according to the second exemplary embodiment of the present invention. FIG. 5 illustrates the cooling device according to the second exemplary embodiment of the present invention before the heat conducting unit 130 is brought into close contact with the interior of the recess 112 in the first heat radiating unit 110. FIG. 6 illustrates the cooling device according to the second exemplary embodiment of the present invention after the heat conducting unit 130 is brought into close contact with the interior of the recess 112 in the first heat radiating unit 110. Referring to FIG. 5 and FIG. 6, the same reference numerals as in FIG. 1, FIG. 2, FIG. 3, and FIG. 4 denote the same elements.

FIG. 5 and FIG. 6 will be compared with FIG. 3 and FIG. 4. FIG. 5 and FIG. 6 show a pressing unit having a configuration different from that shown in FIG. 3 and FIG. 4. More specifically, referring to FIG. 3 and FIG. 4, the pressing unit 500 includes the bag body 140a, the plate member 150a, and the plate member fastening screw 160a. On the other hand, referring to FIG. 5 and FIG. 6, a pressing unit 500A includes a biasing member 180 and a biasing member fastening screw 190. In this respect, FIG. 5 and FIG. 6 are different from FIG. 3 and FIG. 4.

Referring to FIG. 5 and FIG. 6, the pressing unit 500A according to the present invention includes the biasing member 180 and the biasing member fastening screw 190.

The pressing unit 500A presses the heat conducting unit 130 toward the first heat radiating unit 110. Hence, the pressing unit 500A brings the heat conducting unit 130 into close contact with the first heat radiating unit 110.

Referring to FIG. 5 and FIG. 6, the biasing member 180 according to the present invention includes a plurality of elastic members 181 and three metal plates 182, 183, and 184.

Referring to FIG. 5 and FIG. 6, the elastic members 181 are interposed between the metal plates 182 and 183. The elastic members 181 connect the metal plates 182 and 183 to each other. The elastic members 181 bias the metal plates 182 and 183 in a direction to widen the gap between the metal plates 182 and 183. The elastic members 181 are interposed between the metal plates 182 and 184. The elastic members 181 connect the metal plates 182 and 184 to each other. The elastic members 181 bias the metal plates 182 and 184 in a direction to widen the gap between the metal plates 182 and 184. Referring to FIG. 5, the elastic members 181 are compressed by fastening the biasing member fastening screw 190. On the other hand, referring to FIG. 6, releasing the fastening of the biasing member fastening screw 190 stretches the elastic members 181, which bias the metal plates 182, 183, and 184. The elastic members 181 are implemented using, for example, leaf springs or helical springs. The elastic members 181 are made of a material such as phosphor bronze or a resin material.

Referring to FIG. 5 and FIG. 6, the biasing member fastening screw 190 is inserted into screw holes (not illustrated) formed in the metal plates 182, 183, and 184, so that the biasing member fastening screw 190 fastens the metal plates 182, 183, and 184 to each other in a closed state. Removing the biasing member fastening screw 190 from the metal plates 182, 183, and 184 stretches the elastic members 181, which bias the metal plates 182, 183, and 184. This opens the gaps between the metal plates 182, 183, and 184.

Next, the operation of the pressing unit 500A of the second exemplary embodiment will be described.

First, as illustrated in FIG. 5, the pressing unit 500A is inserted into the recess 112 in the first heat radiating unit 110 while the gaps between the metal plates 182, 183, and 184 are kept closed by fastening the biasing member fastening screw 190. At this time, the heat conducting unit 130 is interposed between the metal plate 183 and the inner wall defining the recess 112 and between the metal plate 184 and the inner wall defining the recess 112. In other words, the heat conducting unit 130 covers the metal plates 182, 183, and 184.

Referring next to FIG. 6, the biasing member fastening screw 190 is removed from the metal plates 182, 183, and 184 while the pressing unit 500A is kept inserted in the recess 112 of the first heat radiating unit 110. This stretches the elastic members 181. Hence, the elastic members 181 bias the metal plates 182 and 183 in a direction to widen the gap between the metal plates 182 and 183. In addition, the elastic members 181 bias the metal plates 182 and 184 in a direction to widen the gap between the metal plates 182 and 184. As a result, the gaps between the metal plates 182, 183, and 184 are opened so that the heat conducting unit 130 is pressed toward the first heat radiating unit 110. The heat conducting unit 130 is brought into close contact with the first heat radiating unit 110.

As described above, in the cooling device according to the second exemplary embodiment of the present invention, the pressing unit 500A includes a biasing member 180 which biases the heat conducting unit 130 toward the first heat radiating unit 110. This can thermally couple the heat conducting unit 130 and the first heat radiating unit 110 to each other by a simple attaching and detaching operation without any adhesive. Further, the cooling device according to the second exemplary embodiment has no complicated structure between the heat conducting unit 130 and the first heat radiating unit 110. Therefore, the cooling device according to the second exemplary embodiment can keep the thermal resistance between the heat conducting unit 130 and the first heat radiating unit 110 low.

The cooling device according to the second exemplary embodiment of the present invention further includes recesses 112. The recesses 112 are formed in the first heat radiating unit 110. The biasing member 180 is accommodated in each recess 112 and biases the heat conducting unit 130 toward the inner surface defining this recess 112. This can more reliably bring the heat conducting unit 130 into close contact with the inner surfaces defining the recesses 112 in the first heat radiating unit 110. Therefore, the heat conducting unit 130 can be more reliably thermally coupled to the inner surfaces defining the recesses 112 in the first heat radiating unit 110.

Next, a third exemplary embodiment of the present invention will be described in detail.

Figure 7:
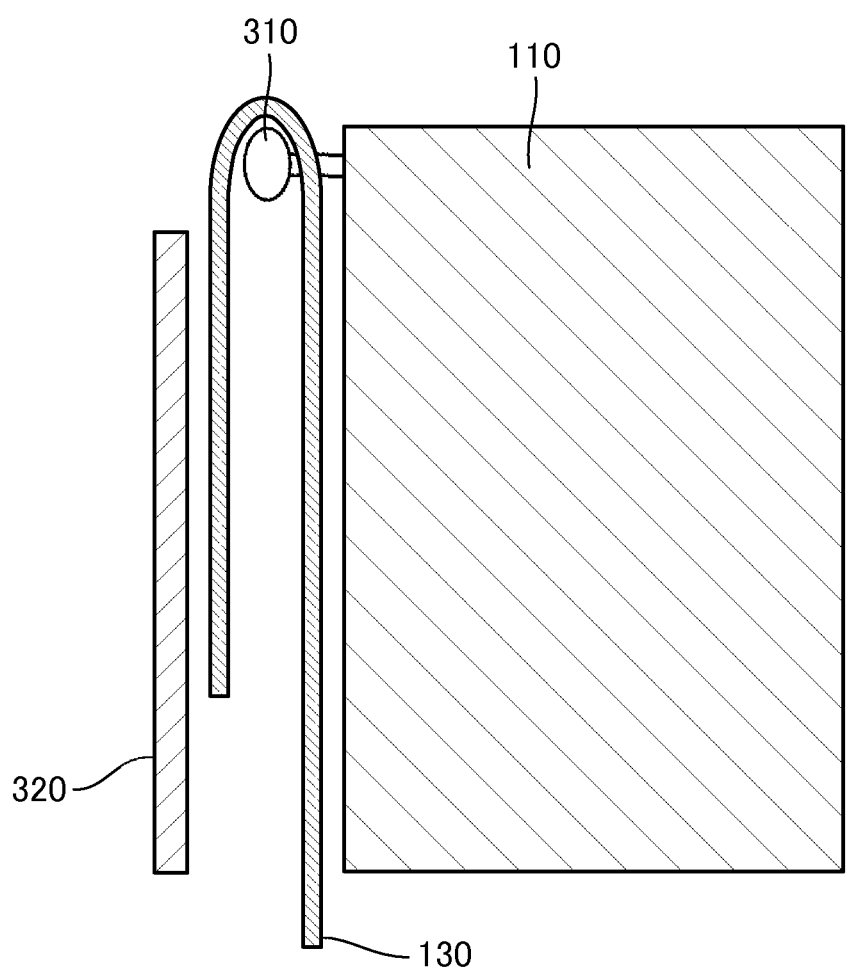
FIG. 7 is a view for explaining a method for bringing a heat conducting unit into close contact with a first heat radiating unit in a third exemplary embodiment of the present invention.
Figure 8:
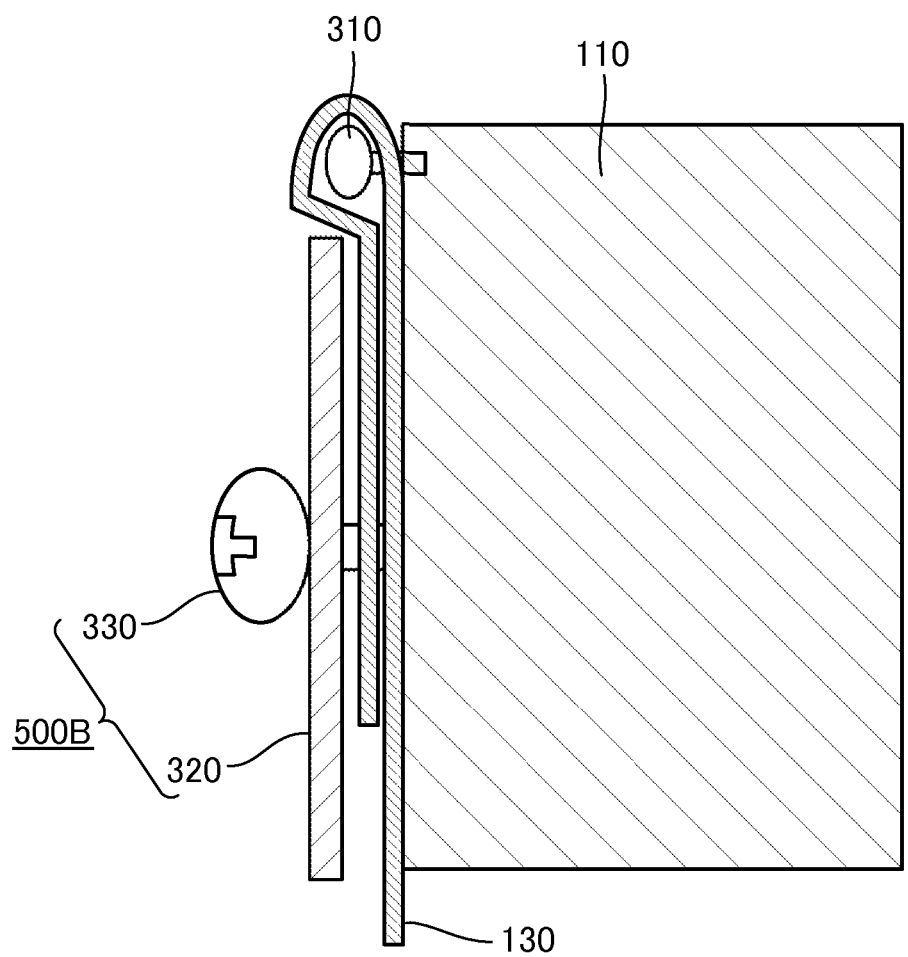
FIG. 8 is a view for explaining the method for bringing the heat conducting unit into close contact with the first heat radiating unit.

FIG. 7 and FIG. 8 are views for explaining a method for bringing a heat conducting unit 130 into close contact with a first heat radiating unit 110. FIG. 7 illustrates the state before the heat conducting unit 130 is brought into close contact with the first heat radiating unit 110. FIG. 8 illustrates the state after the heat conducting unit 130 is brought into close contact with the first heat radiating unit 110. Referring to FIG. 7 and FIG. 8, the same reference numerals as in FIG. 1, FIG. 2, FIG. 3, FIG. 4, FIG. 5, and FIG. 6 denote the same elements.

FIG. 7 and FIG. 8 will be compared with FIG. 3 and FIG. 4. FIG. 7 and FIG. 8 show a pressing unit having a configuration different from that shown in FIG. 3 and FIG. 4. FIG. 3 and FIG. 4 illustrate the vicinity of the recess 112 in the first heat radiating unit 110. On the other hand, FIG. 7 and FIG. 8 illustrate the vicinity of the side surface of the first heat radiating unit 110. In this exemplary embodiment, a recess 112 need not always be formed in the first heat radiating unit 110. Referring to FIG. 3 and FIG. 4, the pressing unit 500 includes the bag body 140a, the plate member 150a, and the plate member fastening screw 160a. On the other hand, referring to FIG. 7 and FIG. 8, a pressing unit 500B includes at least a holding plate 320 and a holding plate fastening screw 330. A hook unit 310 is mounted on the side surface of the first heat radiating unit 110. In this respect, FIG. 7 and FIG. 8 are different from FIG. 3 and FIG. 4.

Referring to FIG. 7 and FIG. 8, the pressing unit 500B according to the present invention includes at least the holding plate 320 and the holding plate fastening screw 330.

The pressing unit 500B presses the heat conducting unit 130 toward the first heat radiating unit 110. This brings the heat conducting unit 130 into close contact with the first heat radiating unit 110.

Referring to FIG. 7 and FIG. 8, the hook unit 310 is mounted on the side surface of the first heat radiating unit 110. The heat conducting unit 130 is hooked on the hook unit 310. More specifically, the heat conducting unit 130 is looped over the hook unit 310.

Referring to FIG. 7 and FIG. 8, the holding plate 320 has a flat plate shape. The holding plate 320 has, for example, a rectangular shape. However, the holding plate 320 is not limited to a rectangular shape and may have a circular, polygonal, or elliptical shape.

Referring to FIG. 7, the holding plate fastening screw 330 fastens the holding plate 320 to the first heat radiating unit 110. Further, the holding plate fastening screw 330 is attached to the first heat radiating unit 110 to clamp the heat conducting unit 130 between the holding plate 320 and the first heat radiating unit 110. Thus, the holding plate 320 presses the heat conducting unit 130 toward the first heat radiating unit 110. The holding plate fastening screw 330 corresponds to a fastening member according to the present invention.

As described above, in the cooling device according to the third exemplary embodiment of the present invention, the pressing unit 500B includes the holding plate 320 and the holding plate fastening screw 330. The holding plate fastening screw 330 fastens the holding plate 320 to the first heat radiating unit 110. Further, the pressing unit 500B attaches the holding plate fastening screw 330 to the first heat radiating unit 110 to clamp the heat conducting unit 130 between the holding plate 320 and the first heat radiating unit 110. Thus, the pressing unit 500B presses the heat conducting unit 130 toward the first heat radiating unit 110. This can thermally couple the heat conducting unit 130 and the first heat radiating unit 110 to each other by a simple attaching and detaching operation without any adhesive. Since no complicated structure is provided between the heat conducting unit 130 and the first heat radiating unit 110, the thermal resistance between the heat conducting unit 130 and the first heat radiating unit 110 can be kept low.

Next, a fourth exemplary embodiment of the present invention will be described in detail.

Figure 9:
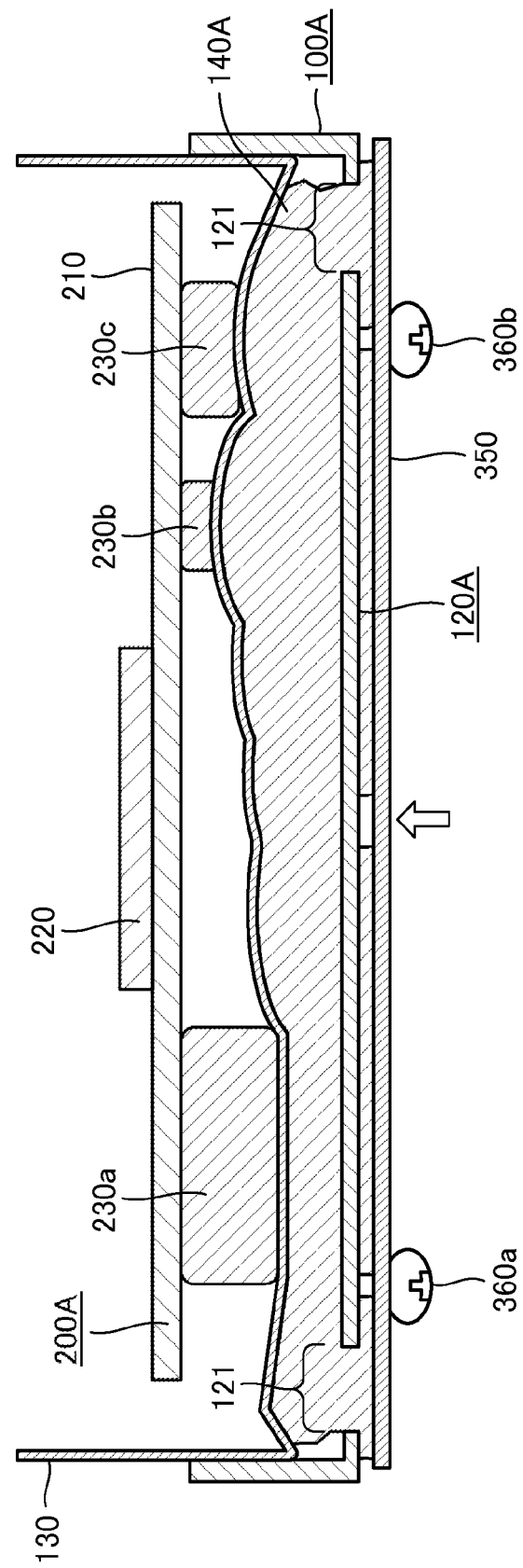
FIG. 9 is a side view illustrating a cooling device mounted on an electronic board in a fourth exemplary embodiment of the present invention.
Figure 10:
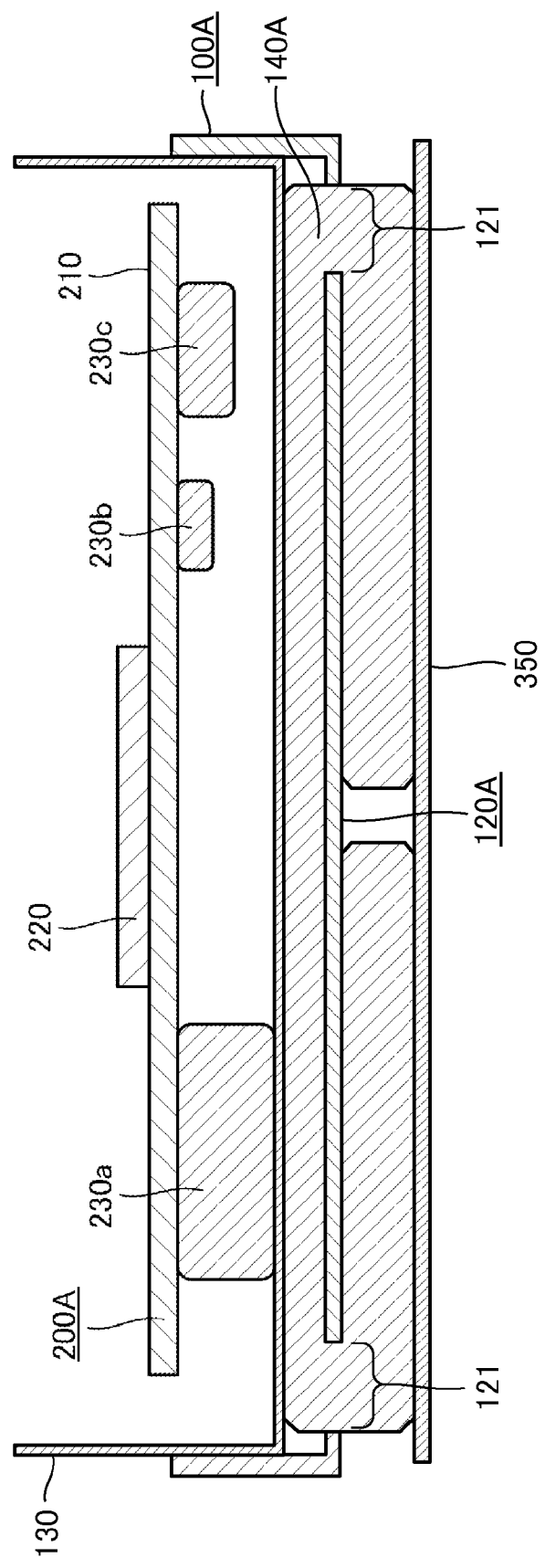
FIG. 10 is a side view showing the state before the cooling device is mounted on the electronic board.

FIG. 9 is a side view illustrating a cooling device 100A as mounted on an electronic board 200A. FIG. 10 is a side view showing the state before the cooling device 100A is mounted on the electronic board 200A. A first heat radiating unit 110 is not illustrated in FIG. 9 and FIG. 10. The same reference numerals as in FIG. 1, FIG. 2, FIG. 3, FIG. 4, FIG. 5, FIG. 6, FIG. 7, and FIG. 8 denote the same elements.

Referring to FIG. 9 and FIG. 10, the cooling device 100A according to the present invention includes a first heat radiating unit (not illustrated), a second heat radiating unit 120A, a heat conducting unit 130, a bag body 140A, a pressing plate 350, and pressing plate screw members 360a and 360b.

FIG. 9 and FIG. 10 will be compared with FIG. 1 and FIG. 2. Referring to FIG. 1 and FIG. 2, the heights (the distances from the lower surface (second surface) of the electronic board 200) of the second heating components 230a and 230b mounted on the lower surface of the electronic board 200 are equal to each other. In contrast to this, referring to FIG. 9 and FIG. 10, the heights (the distances from the lower surface (second surface) of the electronic board 200A) of second heating components 230a, 230b, and 230c mounted on the lower surface of the electronic board 200A are different from each other. In this respect, FIG. 9 and FIG. 10 are different from FIG. 1 and FIG. 2.

Referring to FIG. 1 and FIG. 2, the heat conducting unit 130 is clamped between the second heating components 230a and 230b and the second heat radiating unit 120. Referring again to FIG. 1 and FIG. 2, the pressing units 500 are attached to the two end portions of the first heat radiating unit 110. In contrast to this, referring to FIG. 9 and FIG. 10, no pressing units 500 are attached to the two end portions of the first heat radiating unit 110. Hence, no recesses are formed at the two end portions of the first heat radiating unit (not illustrated in FIG. 9 and FIG. 10). Referring to FIG. 9 and FIG. 10, the bag body 140A is interposed between the heat conducting unit 130 and the second heat radiating unit 120A. Referring again to FIG. 9 and FIG. 10, the heat conducting unit 130 is clamped between the second heating components 230a, 230b, and 230c and the bag body 140A. In these respects as well, FIG. 9 and FIG. 10 are different from FIG. 1 and FIG. 2.

Referring to FIG. 9 and FIG. 10, the second heat radiating unit 120A faces the lower surface (second surface) of a circuit board 210. The lower surface (second surface) of the circuit board 210 is opposite to the first surface (upper surface) of the circuit board 210. The second heat radiating unit 120A includes two openings 121. The use of the openings 121 allows the bag body 140A to enter the space between the upper surface (a surface on the upper side of the paper surface of each of FIG. 9 and FIG. 10) of the second heat radiating unit 120A and the lower surface (a surface on the lower side of the paper surface of each of FIG. 9 and FIG. 10) of the pressing plate 350. Referring to FIG. 9 and FIG. 10, the bag body 140A is twisted around the second heat radiating unit 120A through the openings 121. The second heat radiating unit 120A includes screw holes (not illustrated) to receive the pressing plate screw members 360a and 360b (to be described later).

The heat conducting unit 130 is interposed between the circuit board 210 and the second heat radiating unit 120A. The heat conducting unit 130 is kept in close contact with the outer peripheral portion of one surface (a surface on the upper side of the paper surface of each of FIG. 9 and FIG. 10) of the second heat radiating unit 120A. Although not illustrated in FIG. 9 and FIG. 10, the heat conducting unit 130 is thermally coupled to the first heat radiating unit 110.

The bag body 140A is filled with a liquid or a gas. Referring to FIG. 9 and FIG. 10, the bag body 140A is interposed between the heat conducting unit 130 and the second heat radiating unit 120A. The upper part of the bag body 140A is covered with the heat conducting unit 130. The bag body 140A is filled with a liquid or a gas in an amount adjusted in accordance with the height of the second heating components 230a, 230b, and 230c (the distance from the lower surface of the circuit board 210 to the upper surfaces (surfaces on the lower side of the paper surface of each of FIG. 9 and FIG. 10) of the second heating components 230a, 230b, and 230c) in advance, and is sealed hermetically. The maximum value of the internal volume of the bag body 140A is larger than at least the volume of the filling liquid or gas. The liquid or gas that fills the bag body 140A is movable within the bag body 140A. If the bag body 140A is filled with air, the bag body 140A is also called a large air bag.

Referring to FIG. 9 and FIG. 10, the pressing plate 350 faces the openings 121 formed in the bottom surface of the second heat radiating unit 120A. The pressing plate 350 also faces the heat conducting unit 130 through the openings 121. The pressing plate 350 presses the bag body 140A from the bottom surface side of the second heat radiating unit 120A. The pressing plate 350 moves the air or liquid in the bag body 140A between the second heat radiating unit 120A and the heat conducting unit 130 through the openings 121. This expands the bag body 140A between the second heat radiating unit 120A and the heat conducting unit 130. More specifically, the pressing plate 350 moves the heat conducting unit 130 toward the lower surface (second surface) of the circuit board 210 to thermally couple the heat conducting unit 130 to the second heating components 230a, 230b, and 230c mounted on the lower surface (second surface) of the circuit board 210. The pressing plate 350 is made of a material such as high-rigidity sheet metal. The pressing plate 350 includes screw holes (not illustrated) to receive the pressing plate screw members 360a and 360b (to be described later).

Referring to FIG. 9, the pressing plate screw members 360a and 360b are mounted in the pressing plate 350 and the bottom surface of the second heat radiating unit 120A.

A method for mounting a cooling device 100A on an electronic board 200A will be described below.

An electronic board 200A, a first heat radiating unit 110, and a second heat radiating unit 120A having its outer peripheral portion in close contact with a heat conducting unit 130 are prepared first.

Referring to FIG. 9, the electronic board 200A is mounted on the bag body 140A covered with the heat conducting unit 130. Note that the bag body 140A is interposed between the heat conducting unit 130 and the second heat radiating unit 120A. A first heat radiating unit (not illustrated) is mounted on the electronic board 200A to thermally couple the outer peripheral portion of the first heat radiating unit and the heat conducting unit 130 to each other.

Referring to FIG. 10, in this state, pressing plate screw members 360a and 360b are mounted in the pressing plate 350 and the bottom surface of the second heat radiating unit 120A. The pressing plate screw members 360a and 360b are then fastened. Hence, the pressing plate 350 crushes the bag body 140A jutting out of the openings 121 from the lower side. This compresses the bag body 140A between the pressing plate 350 and the second heat radiating unit 120A. The air or liquid equal in amount to the amount of crush moves between the heat conducting unit 130 and the second heat radiating unit 120A within the bag body 140A. This expands the bag body 140A between the heat conducting unit 130 and the second heat radiating unit 120A.

At the same time, the heat conducting unit 130 moves to follow the expansion of the bag body 140A and is thermally coupled to the second heating components 230a, 230b, and 230c.

As described above, even when the heights of the second heating components 230a, 230b, and 230c mounted on the lower surface (second surface) of the circuit board 210 of the electronic board 200A are different from each other, the use of the bag body 140A allows collective thermal coupling of the heat conducting unit 130 to the second heating components 230a, 230b, and 230c.

Next, the operation of the cooling device 100A of the fourth exemplary embodiment will be described.

More specifically, a sequence executed until radiation of heat generated by the first heating component 220 and second heating components 230a, 230b, and 230c mounted on the two surfaces of the circuit board 210 of the electronic board 200A will be described below.

When power is supplied to the electronic board 200A, the first heating component 220 and the second heating components 230a, 230b, and 230c generate heat.

At this time, since the first heating component 220 and the first heat radiating unit (not illustrated) are thermally coupled to each other, heat generated by the first heating component 220 is transferred to the first heat radiating unit. The first heat radiating unit radiates the heat generated by the first heating component 220.

The second heating components 230a, 230b, and 230c are kept in close contact with the heat conducting unit 130 upon the expansion of the bag body 140A. Therefore, heat generated by the second heating components 230a, 230b, and 230c is transferred to the heat conducting unit 130 first. The heat generated by the second heating components 230a, 230b, and 230c is transferred in the planar direction of the heat conducting unit 130 and further transferred to a first heat radiating unit (not illustrated) connected to the outer peripheral portion of the heat conducting unit 130. This efficiently transfers heat generated by the second heating components 230a, 230b, and 230c to the first heat radiating unit through the heat conducting unit 130.

As described above, both heat generated by the first heating component 220 and heat generated by the second heating components 230a, 230b, and 230c are transferred to the first heat radiating unit. Hence, the first heat radiating unit collectively radiates both heat generated by the first heating component 220 and heat generated by the second heating components 230a, 230b, and 230c.

As mentioned earlier, the cooling device 100A according to the fourth exemplary embodiment of the present invention includes the first heat radiating unit, the second heat radiating unit 120A, the heat conducting unit 130, the bag body 140A, and the pressing plate 350.

The first heat radiating unit is thermally coupled to the first heating component 220 mounted on the upper surface (first surface) of the circuit board 210. The second heat radiating unit 120A faces the lower surface (second surface), opposite to the upper surface (first surface), of the circuit board 210. The heat conducting unit 130 is interposed between the circuit board 210 and the second heat radiating unit 120A. The heat conducting unit 130 is kept in close contact with the outer peripheral portion of one surface of the second heat radiating unit 120A. The heat conducting unit 130 is thermally coupled to the first heat radiating unit. The bag body 140A is filled with a liquid or a gas. The bag body 140A is interposed between the heat conducting unit 130 and the second heat radiating unit 120A. The pressing plate 350 faces the openings 121 formed in the bottom surface of the second heat radiating unit 120A. The pressing plate 350 presses the bag body 140A from the bottom surface side of the second heat radiating unit 120. The pressing plate 350 moves the air or liquid in the bag body 140A between the second heat radiating unit 120A and the heat conducting unit 130 through the openings 121. This expands the bag body 140A between the second heat radiating unit 120A and the heat conducting unit 130. More specifically, the pressing plate 350 moves the heat conducting unit 130 toward the lower surface (second surface) of the circuit board 210 to thermally couple the heat conducting unit 130 to the second heating components 230a, 230b, and 230c mounted on the lower surface (second surface) of the circuit board 210.

In the aforementioned way, the pressing plate 350 presses the bag body 140A from the bottom surface side of the second heat radiating unit 120A to expand the bag body 140A between the second heat radiating unit 120A and the heat conducting unit 130. The pressing plate 350 moves the heat conducting unit 130 toward the lower surface (second surface) of the circuit board 210 to thermally couple the heat conducting unit 130 to the second heating components 230a, 230b, and 230c mounted on the lower surface (second surface) of the circuit board 210. Hence, even when the second heating components 230a, 230b, and 230c mounted on the lower surface (second surface) of the circuit board 210 of the electronic board 200A have different heights, the heat conducting unit 130 can be collectively thermally coupled to the second heating components 230a, 230b, and 230c.

While the embodiments of this invention have been described in conjunction with the preferred embodiments described above, it will now be possible for those skilled in the art to put this invention into practice in various other manners.

What is claimed is:
1. A cooling device comprising:
    a first heat sink which is directly coupled to a first heating component mounted on a first surface of a circuit board;
    a heat conductor which is directly coupled to a second heating component mounted on a second surface of the circuit board and is directly coupled to the first heat sink; and
    a pressing unit which presses the heat conductor toward the first heat sink,
    wherein the heat conductor is directly coupled to the heat sink around a part of the entire periphery of the circuit board.
2. The cooling device according to claim 1, wherein the pressing unit brings the heat conductor into contact with the first heat sink.
3. The cooling device according to claim 1 or 2, further comprising:
    a second heat sink which faces the second surface of the circuit board,
    wherein the heat conductor is in contact with a surface of the second heat sink, which
    faces the second surface of the circuit board.
4. The cooling device according to claim 2, wherein the pressing unit comprises a bag body filled with one of a liquid and a gas, a plate, and a fastener which attaches the plate to the first heat sink, and
    wherein the fastener is attached to the first heat sink to compress the bag body between the plate and the first heat sink.
5. The cooling device according to claim 2, further comprising:
    a recess which is formed in the first heat sink,
    wherein the pressing unit comprises a bag body filled with at least one of a liquid and a gas, a plate, and a fastener which attaches the plate to the first heat sink,
    wherein the heat conductor and the bag body are at least partially accommodated in the recess, and
    wherein the fastener is attached to the first heat sink to compress the bag body between the plate and the first heat sink within the recess.
6. The cooling device according to claim 2, wherein the pressing unit comprises a biasing member which biases the heat conductor toward the first heat sink.
7. The cooling device according to claim 6, further comprising:
    a recess which is formed in the first heat sink,
    wherein the biasing member is accommodated in the recess and biases the heat conductor toward an inner surface of the recess.
8. The cooling device according to claim 2, wherein the pressing unit comprises a holding plate and a fastener which attaches the holding plate to the first heat sink, and
    wherein the fastener is attached to the first heat sink to clamp the heat conductor between the holding plate and the first heat sink.
9. The cooling device according to claim 1, further comprising:
    a second heat sink which comprises an opening in a bottom surface thereof and faces the second surface of the circuit board;
    a heat conductor which is interposed between the circuit board and the second heat sink, is brought into close contact with an outer peripheral portion of one surface of the second heat sink, and is directly coupled to and brought into close contact with the first heat sink;
    a bag body which is filled with one of a liquid and a gas and interposed between the heat conductor and the second heat sink; and
    a pressing plate which faces the opening formed in the bottom surface of the second heat sink,
    wherein the pressing plate presses the bag body from a side of the bottom surface of the second heat sink to move one of the air and the liquid in the bag body between the second heat sink and the heat conductor through the opening,
    wherein the bag body is expanded between the second heat sink and the heat conductor to move the heat conductor toward the second surface of the circuit board, and
    wherein the heat conductor is directly coupled to and brought into close contact with a second heating component mounted on the second surface of the circuit board.
10. The cooling device according to claim 1, wherein the heat conductor is flexible.

11. A device comprising:
a first heating component mounted on a first surface of a circuit board;
a first heat sink which is directly coupled to the first heating component;
a second heating component mounted on a second surface of the circuit board;
a heat conductor which is directly coupled to the second heating component; and
a pressing unit which presses the heat conductor toward the first heat sink,
wherein the second heating component directly coupled to the first heat sink through the heat conductor.

* * * * *